(12) United States Patent
Prokopp et al.

(10) Patent No.: US 6,344,751 B1
(45) Date of Patent: Feb. 5, 2002

(54) FINGER TESTER PROBE

(75) Inventors: Manfred Prokopp, Wertheim Reicholzheim; Roland Stoehr, Nufringen, both of (DE)

(73) Assignee: atg test systems GmbH & Co. KG, Wertheim (DE)

( * ) Notice: Subject to any disclaimer, the term of this patent is extended or adjusted under 35 U.S.C. 154(b) by 0 days.

(21) Appl. No.: 09/390,539

(22) Filed: Sep. 3, 1999

(30) Foreign Application Priority Data

Sep. 28, 1998 (DE) .......................................... 198 44 428

(51) Int. Cl.[7] .............................................. G01R 31/02
(52) U.S. Cl. ........................ 324/754; 324/758; 324/761
(58) Field of Search ................................ 324/72.5, 73.1, 324/158.1, 754, 760, 761; 439/482; 335/78, 229, 253, 266, 268, 295

(56) References Cited

U.S. PATENT DOCUMENTS

| 4,959,609 A | * | 9/1990 | Prokopp et al. | .............. | 324/537 |
| 4,963,822 A | | 10/1990 | Prokopp | | |
| 5,113,133 A | * | 5/1992 | Conti et al. | .................. | 324/754 |
| 5,367,254 A | * | 11/1994 | Faure et al. | .................. | 324/761 |
| 5,448,164 A | * | 9/1995 | Selley et al. | .............. | 324/158.1 |
| 5,532,611 A | | 7/1996 | Lo et al. | ....................... | 324/758 |
| 5,804,982 A | | 9/1998 | Lo et al. | ....................... | 324/758 |
| 5,818,246 A | * | 10/1998 | Zhong | ......................... | 324/754 |

FOREIGN PATENT DOCUMENTS

| EP | 0 068 270 A1 | 1/1983 | ........... H01R/23/72 |
| EP | 0 396 292 A1 | 11/1990 | ........... H01R/23/72 |
| EP | 0 784 252 A1 | 7/1997 | ........... G05B/19/18 |
| EP | 0 990 912 A3 | 4/2000 | ........... G01R/1/067 |
| JP | 0 315 248 | 6/1991 | ........... G01R/31/00 |
| JP | 04 002969 | 1/1992 | ............. G01R/1/06 |
| JP | 6018558 | 1/1994 | ........... G01R/1/073 |

* cited by examiner

Primary Examiner—Ernest Karlsen
Assistant Examiner—Minh N. Tang
(74) Attorney, Agent, or Firm—Darby & Darby

(57) ABSTRACT

The invention relates to a finger tester probe including a probe element for electrically contacting a contact point of a circuit board under test, an actuator including a permanently premagnetized core and a solenoid element. The solenoid element is shiftingly arranged on the permanently premagnetized core and is mechanically connected to the probe element. Upon being energized, the solenoid element is moved together with the probe element. Since in accordance with the invention a movable part of the actuator is not mechanically connected to a fixed part of the actuator, the test probe which is attached to the movable part is able to bring the probe element into contact with a contact point of a circuit board under test at high speed.

26 Claims, 3 Drawing Sheets

FINGER TESTER PROBE

BACKGROUND OF THE INVENTION

1. Field of the Invention

The invention relates to a finger tester probe.

2. Description of Prior Art

Circuit board testers may be basically classified in two groups, namely finger testers and parallel testers. Parallel testers are test devices simultaneously contacting all or at least the majority of the contact points of a circuit board being tested by means of an adapter. Finger testers are test devices for testing non-componented or componented circuit boards which sequentially sample the individual contact points with two or more test fingers.

As a rule the test fingers are secured to a slide travelling on crossbars which in turn are guidingly travelled on guide rails. The slides can thus be positioned to any location of a test area which as a rule is rectangular. For contacting a contact point on the circuit board under test the slide is vertically shiftable on the crossbar so that the test finger is landable on the contact point of the circuit board from above or below.

A finger tester is described in EP 0 468 153 A1 and a method for testing circuit boards by means of a finger tester is described in EP 0 853 242 A1.

Known from U.S. Pat. No. 5,113,133 is a test probe in which a leaf spring serving as the probe element is guided in a linear cavity. For contacting the surface of a test object the probe element is shiftable downwards in this linear cavity, it thereby extending with a tip from the linear cavity to contact a contact pad of the test object. By the end of the contact spring opposite the tip of the leaf spring the contact spring is secured to a rotatable disc, rotation of which causes the leaf spring to be extended or retracted, thus enabling the leaf spring to be moved up and down in the linear cavity by rotation of the disc.

The linear cavity is provided with a side cavity in which the leaf spring is able to relax so that the reactive force occuring in "landing" on the surface of the test object is absorbed.

This probe is intended to provide fast contact between the probe element and a contact pad of the test object whilst the impact of the probe element on the surface of the test object is designed to be non-injurious thereto.

U.S. Pat. No. 5,804,982 describes a test probe for a microchip tester. The test probe comprises an actuator for vertically displacing a probe tip. The actuator consists of two solenoids arranged horizontally and two magnets arranged to the side thereof. This actuator moves two elastic lever arms fixedly arranged at one end, to the other ends of which a mounting element is secured on which in turn the contact element is arranged. In this known test probe the probe tip is moved together with the mounting element against the spring force of the elastic lever arms.

The criterion substantial to finger testers being a success in the marketplace is the speed with which the contact points of the test object can be contacted. Conventional finger testers require approximately 120 ms for a vertical movement of the test finger. The test probe known from U.S. Pat. No. 5,113,133 is faster and requires only a few 10 ms for a vertical movement.

SUMMARY OF THE INVENTION

The invention is based on the object of providing a finger tester probe which is of a simple configuration and is capable of moving a probe element at high speed for contacting a contact point of a test item.

This object is achieved by a finger tester probe comprising a probe element for electrically contacting a contact point of a circuit board under test, an actuator including a permanently premagnetized core and a contact element each movable relative to the other, whereby one of the two parts is fixed and the other part is movable, the movable part being mechanically connected to a probe element so that on being energized the movable part is moved together with the probe element, and the movable part being arranged freely movable relative to the fixed part.

In accordance with the invention the test probe comprises an actuator including a permanently premagnetized core and a contact element movable relative to each other, whereby one of the two parts is fixed and the other is movable, and the movable part is mechanically connected to a probe element so that the movable part is moved together with the probe element on being energized.

The invention is characterized by the movable part being arranged freely movable relative to the fixed part, i.e. no mechanical connection existing between the movable part and the fixed part. Merely one electrical conductor for electrically connecting the probe element to a tester is provided between the fixed and movable part, this electrical conductor being configured so that it is capable of transmitting no or only negligable forces between the movable part and fixed part, as a result of which the movable part is quickly movable without needing to overcome a mechanically resistance.

In one preferred embodiment of the invention the permanently premagnetized core is fixed and the solenoid element forms the movable part which is mechanically connected to the probe element. Since in accordance with the invention the solenoid element and not the core is moved, the mass of the moving parts and thus the inertia of the actuator is maintained low, as a result of which an exceptionally fast movement of the probe is achieved.

In addition to this when the actuator is activated, the solenoid element assumes in each case a zero position and a contact position by predetermining the polarity of the energizing current. Changing over the polarity is abrupt, the being the reasons why also the solenoid element is activated correspondingly abruptly. In addition, for maintaining the solenoid element in the zero position no spring element or the like is needed as is provided in conventional solenoid-operated actuators. Such spring elements increase the inertia of the actuator, this being the reason why maintaining the zero position by means of a holding current enhances the response.

One particularly advantageous embodiment of the test probe is one in which the probe element is an elastic wire guided in a guide passage provided with several cavities. Experience has shown that with such a test probe the force exerted by the wire on a contact point initially increases proportional to the actuating travel and hardly increases further as of a predetermined actuating travel. It is this effect that limits the maximum force exerted on the circuit board.

This effect results from the following:

For curving the wire in a first cavity a predetermined force is needed which is proportional to the actuating travel of the wire as shifted by the actuator and is dicated by the stiffness of the wire and the geometry of the cavity. If the wire is curved in a first cavity, it is curved in a second or third cavity on further actuation by the actuator, whereby the force to be applied by the actuator in this case or the counterforce to be provided by the contact point corresponds to the force needed in the first cavity. The further, very slight increase in the forces is caused by the additional friction between the wire and the guide passage. By this configuration, of the test probe the force exerted maximally by the probe element on the contact point of a circuit board is limited to a predetermined value. Limiting the force in this way follows constructively, this being the reason why there is no need to limit the feed rate when activating the probe element for contacting the contact point as is known in conventional finger testers.

This principle of constructively limiting the force exerted by the probe element on the circuit board under test is a gist of the invention.

A further embodiment includes a finger tester comprising a means for adjusting the vertical position of the test probe and the test probe is provided with an actuator capable of actuating a probe element independently of the means for adjusting the vertical position of the test probe in the vertical direction for contacting a contact point of a circuit board.

By the means for adjusting the vertical position of the test probe a coarse setting of the test probe relative to a circuit board under test is undertaken whereby the spacing between the circuit board and the test probe is adjusted preferably to a small value such as e.g. smaller than 2 mm or smaller than 1 mm. As a result of this, the actuator needs to actuate the probe element only by this short spacing between the circuit board and the test probe which is much simpler and quicker to implement than when the usual spacing of a few millimeters between a starting position of a test finger and a circuit board under test needs to be overcome.

It is this high-speed contacting of a contact point that makes the test probe in accordance with the invention particularly suitable for testing non-componented circuit boards requiring a very large number of circuit board test points to be tested. The test probe in accordance with the invention is also suitable for testing componented circuit boards, however.

BRIEF DESCRIPTION OF THE DRAWINGS

The invention will now be explained in more detail by way of example with reference to the attached drawings in which.

DETAILED DESCRIPTION

Figure 1:
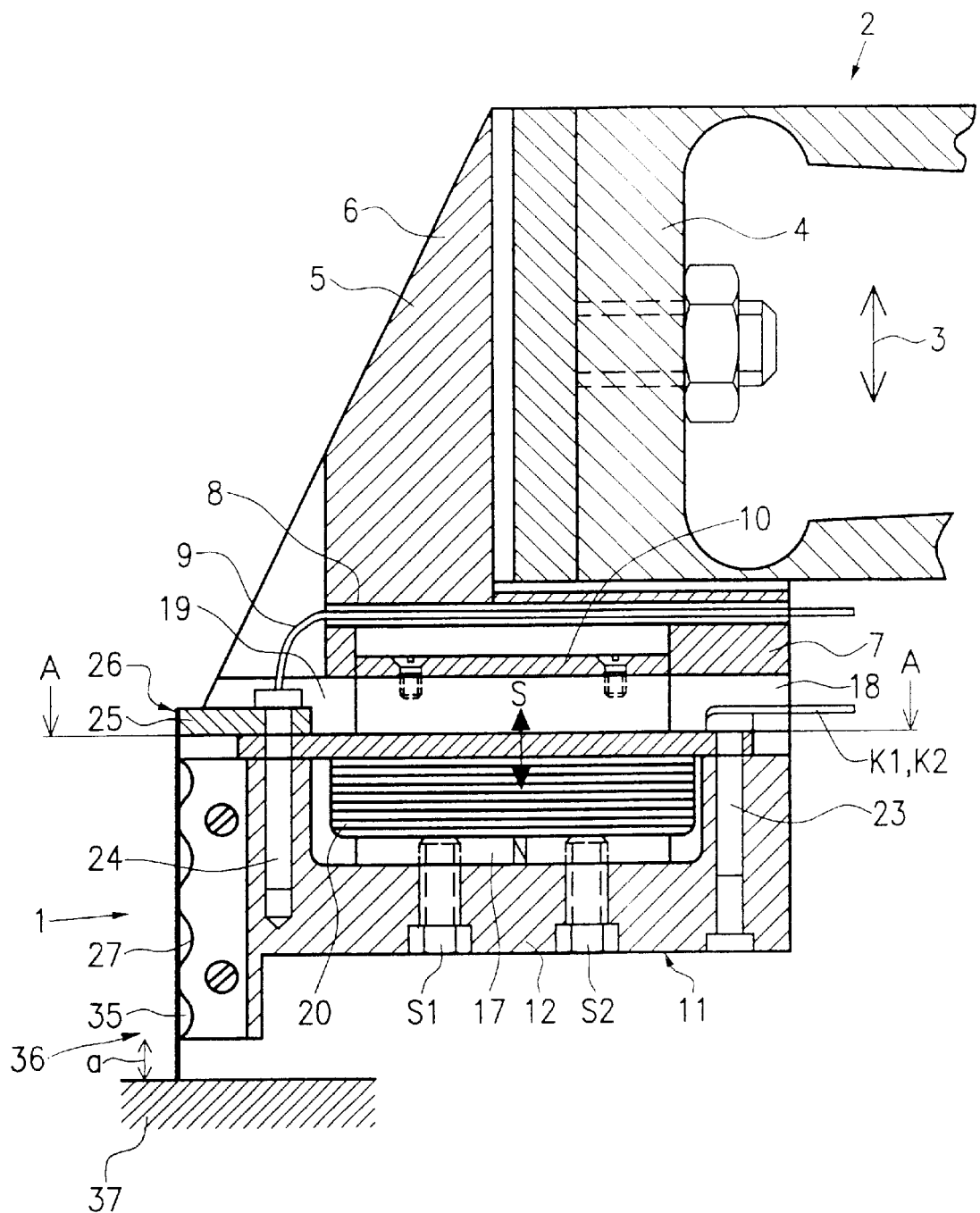
FIG. 1 is a vertical section through a test probe in accordance with the invention and through part of the slide of the finger tester to which the test probe is secured.

Referring now to FIG. 1 there is illustrated the test probe 1 in accordance with the invention as provided for a finger tester comprising a slide 2. The slide 2 may be travelled parallel to a test area (in X and Y direction) by ways and means known as such and comprises a vertical shifting means (in the direction of the double arrow 3).

The slide 2 is provided with a mount 4 for securing the test probe 1. The test probe is releasably secured by means of a support 5 to the mount 4 of the slide 2, the test probe in the example embodiment as shown being secured by means of a screw fastener to the slide 2.

In the example embodiment as shown in FIG. 1 the test probe 1 extends downwards from the slide 2. This arrangement is employed for contacting an electrical circuit board from above, it being just as possible, of course, to contact a circuit board from below, an inverse arrangement of slide 2 and test probe 1 then being used. Finger testers also exist which permit testing a circuit board on both sides and thus comprise test probes both above and below the circuit board. In the following description the terms "top" and "bottom" are used in accordance with the arrangement as shown in FIG. 1.

The support 5 comprises a vertical wall 6 roughly L-shaped in the side-view with a leg 7 extending under the mount 4. Incorporated in this leg 7 is a horizontal, narrow through-hole 8 through which a probe cable 9 is guided. Provided at the bottom edge of the vertical wall 6 is a horizontal mounting plate 10. This mounting plate 10 is made preferably of a soft magnetic material, whereby it may be expedient to make the whole support 5 integrally of this material to assist fabrication.

Figure 2:
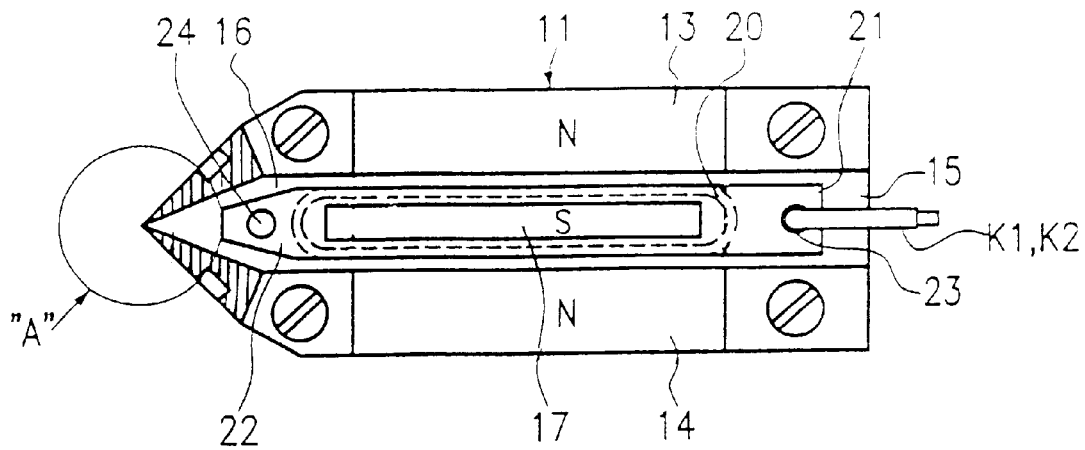
FIG. 2 is a cross-section through the test probe as shown in FIG. 1 taken along the line A—A and viewed in the direction of the arrows.
Figure 3:
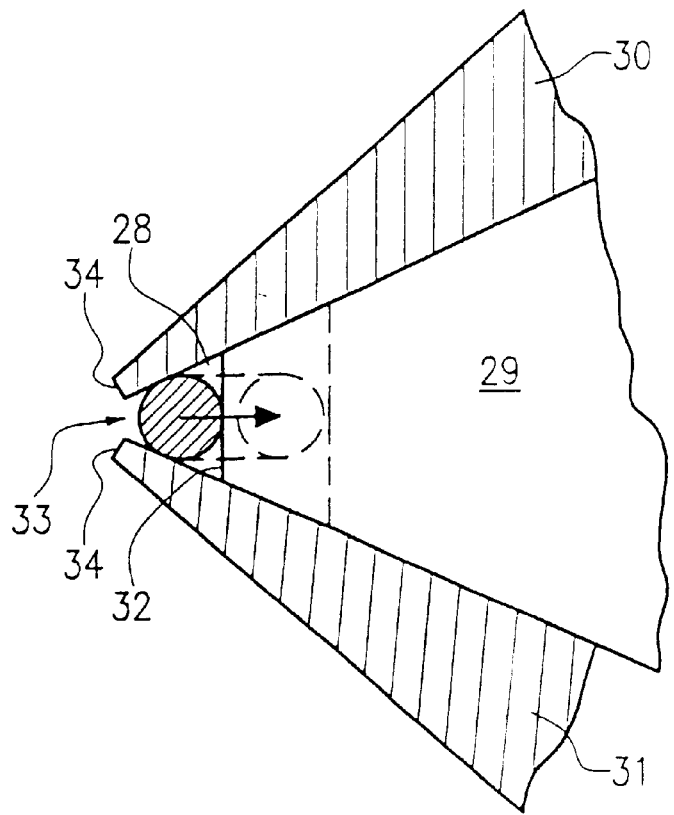
FIG. 3 is a magnified view of a guide passage for a wire as shown in in FIG. 2, and FIGS. 4a–4c illustrate schematically an alternative embodiment for actuating several test probes by means of a single actuator.

Referring now to FIGS. 1 through 3 in which details of the test probe 1 are shown in various views. Applied to the horizontal mounting plate 10 from underneath is a probe housing 11. The probe housing 11 comprises a bottom wall 12, two side walls 12, 14 and two end walls 15, 16. The side walls 13, 14 are higher than the end walls 15, 16 so that between the upper edges of the end walls 15, 16 and the mounting plate 10 a communicating gap 18, 19 is configured in each case. In one embodiment, each of the mounting plate 10 and the bottom wall 12 may be thought of as a yoke member which is attached to one or more surrounding members to form a portion of the test probe 1.

Provided parallel to the side walls 13, 14 is a plate-shaped iron core 17 which like the bottom wall 12 and the mounting plate 10 is made of a soft magnetic material. The iron core 17 is secured by means of two screws S1, S2 to the bottom wall 12.

The upper edge of the iron core 17 is in-line preferably with the upper edges of the side walls 13, 14 so that when the housing 11 is secured to the mounting plate 10 the iron core is urged against the latter to be in contact therewith.

The side walls 13, 14 are configured as permanent magnets, they being arranged e.g. with their north pole N facing upwards. The two magnets 13, 14 are magnetically connected to the core 17 by the bottom wall 12 and the mounting plate 10, as a result of which core 17 is permanently premagnetized, it comprising a pole arrangement opposite to that of the magnets 13, 14. In the example embodiment as shown in FIG. 1 the core comprises in the region of its upper edge a south pole S and in the region of its lower edge a noth pole N.

The iron core 17 is arranged roughly centered in the cavity defined by the walls 12 to 16 so that between the iron core 17 and the two end walls 15, 16 and the two side walls 13, 14 an interspace is configured in each case.

In the interspace between the iron core 17 and the walls 13 to 16 surrounding the latter a solenoid element 20 is inserted. This solenoid element 20 is seated freely movable on the iron core 17, i.e. no mechanical connection whatsoever existing between the iron core 17 and the solenoid element 20. The solenoid element 20 consists of a tubular supporting body about which the solenoid is wound. The tubular supporting body has a low profile so that it surrounds the iron core with a minor clearance. The supporting body is configured in the region of the face sides at its upper edges with tongues 21, 22 each protruding into the corresponding communicating gap 18, 19. The supporting body is made of a thin sheet of aluminum so that it is light and has hardly any effect on the magnetic field generated by the solenoid.

Incorporated in each of the two tongues is a hole in which a guide pin 23, 24 is secured directed downwards. The guide pins 23, 24 are inserted in vertical guide holes configured in the end walls 15, 16 of the housing 11 so that the solenoid element 20 is guided shiftingly vertically.

Arranged at the tongue 21 are two electrical cables K1, K2 which connect the solenoid to a power supply signalled by a control means. The cables K1, K2 are guided through the gap 18 from the solenoid element 20 to outside of the housing.

The upper edges of the end walls 15, 16 form a stop for the tongues 21, 22 of the solenoid element, the tongues come into contact with the stops when the test probe is actuated (FIG. 1), i.e. when the solenoid element is energized by a current of corresponding polarity. This position as shown in FIG. 1 is termed the contact position in which a probe element 26 is in contact with a contact point of a circuit board 37 under test.

By energizing the solenoid element 20 with a current of opposite polarity to that of the contact position the solenoid element 20 is shifted upwards against the mounting plate 10 to assume a zero position in which the probe element 26 is not in contact with one of the contact points of the circuit board under test.

The height of the communicating gaps 18, 19 thus defines the maximum stroke of the solenoid element 20.

At the tongue 21 of the supporting body the electrical cables of the solenoid are brought out through the communicating gap 18 from the housing 11. The opposite tongue 22 is configured tapered and provided at the upper side with a contact pad 25. Extending through the contact pad 25 is the guide pin 24. Guide pin 24, contact pad 25 and tongue 22 are soldered to each other. It is at this solder point that the probe cable 9, guided in a curve from the through-hole 8 to the solder point, is connected mechanically and electrically to the contact pad 25 and guide pin 24 respectively.

The contact pad 25 protrudes beyond the tongue outwards, i.e. directed away from the housing. At the edge remote from the housing 11 the contact pad 25 includes a clamping means at which a wire 27 is replaceably clamped in place. The wire 27 is clamped in place by one end to the contact pad 25 and extends from the contact pad 25 downwards through a guide passage 28.

The guide passage 28 is defined by a plastics body 29 and two ceramic pads 30, 31. FIG. 3 is a magnified view of the guide passage 28 for the wire 27 and further illustrating the surrounding elements of the probe element 26.

The plastics body 29 comprises a roughly triangular cross-section, it being secured by one flat side to the end wall 16 of the housing 11 and the edge of the plastics body 29 arranged remote from the end wall 16 forms a narrow guide flat 32.

The ceramic pads 30, 31 are secured to the two side surface areas of the plastics body 29 adjoining the guide flat 32, e.g. by means of a screw fastener so that they converge at an acute angle, they defining by their end edges 34 a gap 33 which is narrower than the thickness of the wire 27. The ceramic pads are tapered in the direction of their free end edges 34.

The guide flat 32 is configured corrugated in the side-view so that the guide passage 28 comprises cavities 35 arranged on a regular center-spacing, the function of which is explained further on.

The plastics body 29 and the ceramic pads 30, 31 form a probe head 36 in line with the upper edge of the end wall 16 of the housing 11 and protruding by a portion downwards beyond the outer surface area of the bottom wall 12 of the housing. The hard ceramic pads 30, 31 form a reliable protection for the probe head should it collide with a solder pad or the like jutting up from the circuit board. In addition to this the ceramic pads 30, 31 are electrically insulating so that they prevent any wrong electrical contact in the region of the probe head.

The function of the test probe in accordance with the invention will now be explained for a finger tester.

In a starting position the solenoid is energized with a specific holding current, as a result of which the solenoid element 20 is lifted by a specific height h so that the wire 27 is retracted into the guide passage 28. The full clearance in the vertical movement of the solenoid element is e.g. 1 mm.

To actuate the test probe the solenoid element receives a current polarized opposite to that of the holding current so that due to the magnetic field of the core 17 a downwards force is abruptly exerted on the solenoid element until the tongues 21, 22 come into contact with the upper edges of the end walls 15, 16.

The mass to be moved (solenoid element, contact pad, guide pins and wire) is low and in addition to this no mechanically forces, such as e.g. spring forces or the like, need to be overcome in the transition from the zero position into the contact position since the solenoid element 20 is freely movable, this being the reason why an actuating stroke of 0.5 mm is implementable within 5 ms and if the entire mass to be moved is smaller than 3 g, within 2 ms.

After insertion of a circuit board 37 to be tested in the finger tester the test probe 1 is oriented vertical relative to the circuit board by shifting the slide 2, a spacing a between the probe head 36 and the circuit board 37 of e.g. 0.5 mm or less being thereby set.

The test probe 1 is then travelled parallel to the surface of the circuit board under test, the test probe being actuated on attaining a contact point and the probe element, the wire 27, vertically shifted to produce an electrical contact with the contact point.

For horizontal movement from one contact point to another contact point roughly 50 ms is needed usually. For the vertical movement less than 5 ms is needed by the test probe in accordance with the invention so that the vertical movement results in only a minor percentage of the time needed—less than 10% —in the movement as a whole. Conventional finger testers require approximately 120 ms for a vertical movement.

On actuation of the test probe the wire 27 is advanced in the guide passage 28 until it comes into contact with the surface of the circuit board under test. The solenoid element 20 continues its movement oriented in the direction of the circuit board until its tongues come up against the upper edges of the end walls 15, 16 of the housing, as a result of which the wire 27 is urged further into the guide passage 28, it curving initially into a first cavity 35. For curving the wire 27 a specific force is needed which is roughly proportional to the actuating travel during curving. After curving into a first cavity 35 the wire 27 is able to curve into a second or, if needed, a third cavity. The forces to be applied for this purpose by the solenoid element are roughly the same and are increased only slightly by the increasing frictional forces between the guide passage 28 and the wire 27.

Since the corresponding counterforce is in contact with the surface of the circuit board under test this force is limited to that for curving the wire into one of the cavities. In the example embodiment as shown in FIG. 1 a wire made of spring steel or a copper/beryllium alloy, such as e.g. CuBe2 with a gage of 40 μm is used. The force exerted maximally by the wire 27 on a circuit board under test corresponds roughly to a mass of approximately 12 g to 15 g (0.12 N to 0.15 N). The amount of this force can be set by altering the shape of the cavities 35, i.e. elongating the vertically extent of the cavities 35 results in less force being needed to curve the wire 27 and thus achieving a smaller force limitation.

It is this limitation in the force exerted by the wire 27 on the circuit board 37 that reliably prevents damage to the contact points of the circuit boards under test due to high "landing" forces. In conventional finger testers it is the speed with which the test fingers are advanced towards the contact points that is restricted, thus resulting in long advance times of e.g. approximately 120 ms.

In addition to this, the test probe in accordance with the invention is configured highly compact, i.e. it having a length of approximately 2.5 cm and a depth of 0.8 cm. This compact configuration of the test probe permits a plurality of test probes to be arranged in a matrix on a longitudinal center-spacing of e.g. 3 cm and a transverse center-spacing of e.g. 1 cm, whereby each test probe may be activated individually. Such a matrix having roughly the size of a test area needs to be moved by not more than 3 cm longitudinally and not more than 1 cm transversely for contacting any contact point on the circuit board, thus drastically reducing the time needed for the horizontal movement and achieving yet a further reduction in the time needed for testing.

Such a matrix array may also be split up into several parts mutually shiftable so that also contact points not arranged in the pattern of the sub-matrixes of the circuit board under test can be contacted.

The sub-matrixes may be split up e.g. into two rectangular sub-matrixes located juxtaposed, whereby both sub-matrixes or only one sub-matrix are/is arranged shiftable on the circuit board under test. In one advantageous embodiment the sub-matrixes are nested similar to a checkerboard pattern, the test points of the one matrix then being arranged on the white fields and the test points of the other matrix on the black fields of the checkerboard pattern. Configured between the adjacent test points are free interspaces in each case permitting mutually shifting of the two matrixes.

In this embodiment the wire 27 is guided in an upper and a lower guide tube section 40a, 40b respectively. The guide tube sections 40a, 40b are arranged inline and spaced away from each other, the wire 27 extending beyond the immediate portion. The wire is fixed to the upper edge of the upper guide tube section 40a.

In this embodiment the wire 17 is guided in an upper and a lower guide tube section 40a, 40b respectively. The guide tube sections 40a, 40b are arranged inline and spaced away from each other, the wire 17 extending beyond the intermediate portion. The wire is fixed to the upper edge of the upper guide tube section 40a.

Figure 4A:
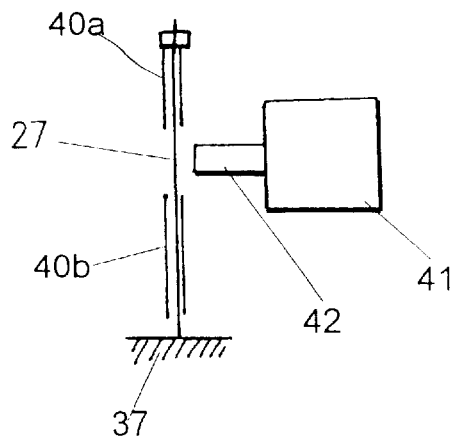
Figure 4B:
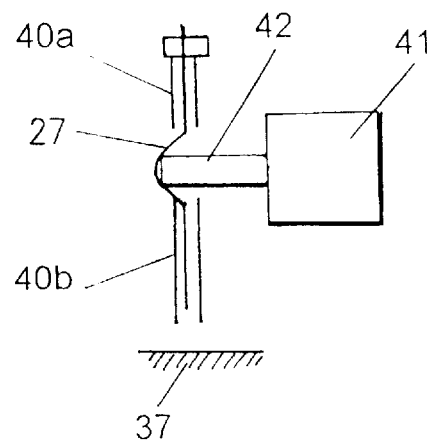
Figure 4C:
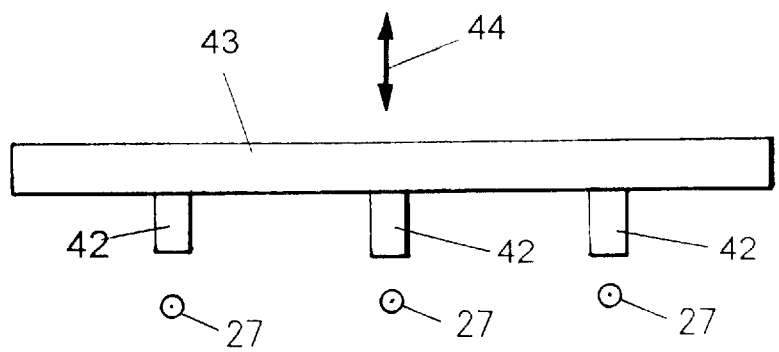

A solenoid-operated actuator 41 is arranged with its actuating piston 42 adjoining the wire 27 so that the actuating piston 42 can be advanced, in the intermediate portion between the guide tube sections 40a, 40b to curve the wire 27 (FIG. 4b). Due to this curving of the wire 27 the lower tip thereof is retracted into the lower guide tube section 40b and thus from a circuit board 37 under test. Retracting the actuating piston 42 from the intermediate portion between the guide tube sections 40a, 40b results in the wire 27 being translated again into its extended condition (FIG. 4a) so that the circuit board 37 under test is contacted by the wire 27.

To actuate several test probes or several wires 27 simultaneously several actuating pistons 42 are secured to a rod 43 actuated by a single actuator (not shown) in the direction of the double arrow 44 to curve and reextend the wires 27 arranged adjacent to the actuating piston 42. With such an actuator whole rows of a matrix array may be actuated simultaneously thus making for a substantial time saving and simplification of the mechanism.

It is, however, also basically possible to provide this kind of actuator for one wire only.

It will be appreciated that while the invention has been described by way of an example embodiment it is not restricted to this concrete embodiment, it also being possible without leaving the scope of the present invention to replace the clamping means by an insertion element with a corresponding companion insertion element. Furthermore, the magnetic parts 12, 13, 14, 17 of the housing 11 may be incorporated in a further thin-walled protective housing.

What is claimed is:

1. A finger tester probe comprising a probe element for electrically contacting a contact point of a circuit board under test, an actuator including a permanently premagnetized core and a solenoid element with one being movable relative to the other, whereby one of said premagnetized core and said solenoid element is fixed and the other of said premagnetized core and said solenoid element is movable, said movable part being mechanically connected to a probe element so that on being energized said movable part is moved together with said probe element, and said movable part being arranged freely movable relative to said fixed part, wherein said probe element is an elastic wire guided in a guide passage provided with at least one cavity into which said wire is able to curve when loaded.

2. The test probe as set forth in claim 1 wherein said permanently premagnetized core is fixed and said solenoid element is movable and mechanically connected to said probe element.

3. The test probe as set forth in claim 2 wherein said solenoid element and said probe element are components of a unit movable in said test probe, whose mass is less than 10 g.

4. The test probe as set forth in claim 3 wherein said solenoid element is arranged vertically shiftable on said core.

5. The test probe as set forth in claim 4 wherein said core is a permanent magnet.

6. The test probe as set forth in claim 1 wherein said core is configured of a soft magnetic material and at least one magnet is provided which is magnetically connected to said core so that said core is permanently premagnetized.

7. The test probe as set forth in claim 6 wherein said core is arranged between two plate-shaped permanent magnets, said core and said permanent magnets being connected to each other magnetically at their upper and lower edges via first and second yokes respectively.

8. The test probe as set forth in claim 7 wherein said plate-shaped permanent magnets form side walls and one of said two yokes form a bottom wall of a housing and the other yoke forming a horizontally mounting plate of a support securable to a slide.

9. The test probe as set forth in claim 1 wherein said solenoid element comprises a tubular supporting body made of a thin sheet of aluminum and a solenoid wound around said supporting body.

10. The test probe as set forth in claim 8 wherein said solenoid element comprises a tubular supporting body made of a thin sheet of aluminum and a solenoid wound around said supporting body.

11. The test probe as set forth in claim 1 wherein a stop is provided for limiting the travel of said solenoid element so that on movement of said solenoid element for contacting said probe element with a contact point of a circuit board under test said solenoid element is shifted against said stop.

12. The test probe as set forth in claim 10 wherein a stop is provided for limiting the travel of said solenoid element so that on movement of said solenoid element for contacting said probe element with a contact point of a circuit board under test said solenoid element is shifted against said stop.

13. A method of activating a test probe configured as set forth in claim 1 comprising the steps of:

supplying said solenoid element with a constant holding current in a zero position so that said solenoid element is shifted by a predetermined stroke relative to a contact position of said solenoid element defined by a stop and applying a current to the solenoid element, said current being opposite in polarity to that of said holding current so that said solenoid element is shifted against said stop for contacting a contact point of a circuit board.

14. The test probe as set forth in claim 1 wherein the thickness of said wire is less than 50 $\mu$m.

15. The test probe as set forth in claim 1 wherein said guide passage incorporates at least three cavities arranged on a regular center-spacing.

16. The test probe as set forth in claim 15 wherein said guide passage configured in a probe head, said probe head comprising a plastics body and two ceramic pads.

17. The test probe as set forth in claim 16 wherein said plastics body comprises a roughly triangular cross-section as viewed from above, one vertically oriented edge of said plastics body forming a narrow guide flat and said ceramic pads being secured to the side surface areas adjoining said guide flat and protruding therefrom, they converging at an acute angle to each other so that said guide flat and said ceramic pads define said guide passage.

18. The test probe as set forth in claim 17 wherein said guide flat is configured corrugated in side-view so that said guide passage is provided with said cavities.

19. A finger tester for testing circuit boards including a plurality of probe elements for electrically contacting contact points of a circuit board under test, wires as said probe elements, wherein to each respective probe element an actuating piston is assigned which actuates said probe element and causes displacement of said wire from a first extended position in which said wire is in contact with said circuit board to a second retracted position, wherein actuation of said piston causes said wire to be curved by contact with said actuating piston and retracted from said circuit board, retraction of said actuating piston relative to said wire causing said wire to be extended to contact said circuit board, the actuating pistons being secured to a single rod actuated by a single actuator.

20. The test probe as set forth in claim 19 wherein said wire is guided in an upper and lower guide tube section, said guide tube sections being arranged in-line and spaced away from each other and said wire extending over intermediate portions in which said actuating piston is reciprocatable for curving said wire.

21. A finger tester for testing circuit boards including a test probe including a probe element for electrically connecting a contact point of a circuit board under test, an actuator including a permanently premagnetized core and a solenoid element each movable relative to the other, whereby one of said premagnetized core and said solenoid element is fixed and the other of said premagnetized core and solenoid element is movable, said movable part being mechanically connected to a probe element so that one being energized said movable part is moved together with said probe element, and said movable part being arranged freely movable relative to said fixed part, at least two slides horizontally shiftable over a test area, a test probe being securable to each slide, and a means for adjusting the vertical position of said test probe, where said actuator of said test probe is capable of actuating said probe element independently of said means for adjusting said vertical position of said test probe in the vertical direction for contacting a contact point of a circuit board.

22. The finger tester as set forth in claim 21 wherein a working stroke of said actuator implemented to contact a contact point is less than 2 mm.

23. The finger tester as set forth in claim 21 wherein several probe elements are actuatable by a single actuator.

24. A finger tester for testing circuit boards comprising a plurality of test probes provided in a matrix array, each said test probe including an elastic wire guided in a guide passage provided with at least one cavity into which said wire is able to curve when loaded, said complete matrix array being moved horizontally over a circuit board under test and each test probe being actuatable by action of an actuator causing displacement of one corresponding probe element in the vertical direction, said test probes being actuatable independently of each other.

25. The finger tester as set forth in claim 24 wherein said matrix array is divided into several sub-matrixes, said sub-matrixes being configured shiftingly relative to each other.

26. A finger tester for testing circuit boards including a test probe, at least two slides horizontally shiftable over a test area, a test probe being securable to each slide; and a means for adjusting the vertical position of said test probe, wherein said test probe comprises an actuator capable of actuating a probe element independently of said means for adjusting said vertical position of said test probe in the vertical direction for contacting a contact point of a circuit board.

* * * * *